(12) United States Patent  
Chida et al.

(10) Patent No.: US 7,363,908 B2  
(45) Date of Patent: Apr. 29, 2008

(54) ELECTRIC PARTS ATTACHING STRUCTURE AND ATTACHING METHOD FOR THROTTLE BODY, AND THROTTLE BODY

(75) Inventors: Toshiaki Chida, Kakuda (JP); Satoshi Chida, Utsunomiya (JP); Kenichi Nomura, Yokohama (JP)

(73) Assignee: Keihin Corporation, Tokyo (JP)

( * ) Notice: Subject to any disclaimer, the term of this patent is extended or adjusted under 35 U.S.C. 154(b) by 256 days.

(21) Appl. No.: 10/547,895

(22) PCT Filed: Mar. 17, 2004

(86) PCT No.: PCT/JP2004/003571

§ 371 (c)(1),
(2), (4) Date: Sep. 2, 2005

(87) PCT Pub. No.: WO2004/083616

PCT Pub. Date: Sep. 30, 2004

(65) Prior Publication Data

US 2006/0169248 A1    Aug. 3, 2006

(30) Foreign Application Priority Data

Mar. 20, 2003  (JP) ............................. 2003-078538
Mar. 20, 2003  (JP) ............................. 2003-078540

(51) Int. Cl.
*F02D 11/10*    (2006.01)
*G01L 7/00*    (2006.01)

(52) U.S. Cl. ...................... 123/399; 73/756; 123/195 E
(58) Field of Classification Search ................ 123/337, 123/261, 399, 472, 478, 494, 184.21, 195 E, 123/198 E, 361; 73/117.3, 756, 118.1, 118.2

See application file for complete search history.

(56) References Cited

U.S. PATENT DOCUMENTS

| 5,813,886 | A | * | 9/1998 | Shomura ...................... 440/1 |
| 5,987,996 | A | * | 11/1999 | Kim et al. .................... 73/756 |
| 6,142,020 | A | * | 11/2000 | Kim et al. .................... 73/756 |
| 6,382,180 | B2 | * | 5/2002 | Wayama et al. ............. 123/399 |
| 6,412,471 | B1 | * | 7/2002 | Trublowski et al. ........ 123/399 |
| 6,418,908 | B2 | * | 7/2002 | Wayama et al. ............. 123/399 |

FOREIGN PATENT DOCUMENTS

| GB | 2 037 894 | 7/1980 |
| JP | 9-14243 | 1/1997 |
| JP | 11-294216 | 10/1999 |
| JP | 2002-285865 | 10/2002 |
| JP | 2002-295282 | 10/2002 |
| JP | 2003-74379 | 3/2003 |

* cited by examiner

*Primary Examiner*—Willis R. Wolfe, Jr.
(74) *Attorney, Agent, or Firm*—Squire, Sanders & Dempsey, LLP

(57) ABSTRACT

An electric parts attaching structure for a throttle body includes: a throttle body (12) having an intake passage (16) in which a throttle valve (24) is arranged, and a housing (20) for accommodating electric parts formed on the outside thereof; an intake passage information detection sensor (43) which is attached to a bottom section (42) of said housing (20) for detecting information in said intake passage (16); and a circuit board (45) which is disposed on a side opposite to a side facing the bottom section (42), of said intake passage information detection sensor (43), and is attached to said housing (20) in state where connection pins (89) extending from the intake passage information detection sensor (43), are inserted into connection holes (100).

5 Claims, 11 Drawing Sheets

ELECTRIC PARTS ATTACHING STRUCTURE AND ATTACHING METHOD FOR THROTTLE BODY, AND THROTTLE BODY

TECHNICAL FIELD

The present invention relates to an electric parts attaching structure and attaching method for a throttle body. Moreover, the present invention relates to a throttle body having an intake passage in which a throttle valve is arranged, and particularly to a throttle body to which an intake passage information detection sensor, which detects information inside the intake passage, is attached.

The basic application of the present application is Japanese Patent Application No. 2003-78538 and Japanese Patent Application No. 2003-78540, contents of which are incorporated herein by reference.

BACKGROUND ART

As a technique for attaching electric parts to a throttle body, there is a technique of attaching a circuit board having a pre-mounted intake air pressure sensor, to a housing of a throttle body which has an intake passage in which a throttle valve is arranged, and has the housing formed outside thereof for accommodating electric parts (for example, refer to Japanese Unexamined Patent Application, First Publication No. 2002-285865).

However, when attaching the circuit board, it needs to be disposed in the housing while fitting the intake air pressure sensor attached to this circuit board into a through hole in a bottom section of the housing. Therefore, there has been a problem in that the intake air pressure sensor cannot be fitted into the through hole well, due to obstruction of an operator's vision by the circuit board, and the attaching operation cannot be carried out well. Therefore, if a shock is imparted to the intake air pressure sensor by hitting the intake air pressure sensor against the bottom section of the housing during the attaching process, there has been a possibility of an influence of some kinds on the intake air pressure sensor itself, and an influence of some kinds on the attachment status of the intake air pressure sensor to the circuit board. This kind of problem is a common problem which arises when providing an intake passage information detection sensor such as an intake air pressure sensor and a flow rate sensor, which detect information in the intake passage.

A first object of the present invention is to provide an electric parts attaching structure and attaching method for a throttle body whereby the intake passage information detection sensor can be easily attached to the housing without any loss of reliability.

Meanwhile, as a technique relating to a throttle body having an intake passage in which a throttle valve is arranged, and to which an intake passage information detection sensor for detecting information in the intake passage, is attached by inserting an insertion section into an insertion hole that communicates with the intake passage, there is a technique in which a base section is formed around the insertion hole on the throttle body side, and a sealing member is fitted around this base section and around the insertion section of the intake passage information detection sensor projecting upward from the base section (for example, refer to Japanese Unexamined Patent Application, First Publication No. Hei 11-294216).

However, in this throttle valve, for example, after fitting the sealing member around the base section, the insertion section of the intake passage information detection sensor needs to be inserted into the insertion hole, while being fitted to the inside of the sealing member. In this case, there is a chance of the sealing member being bent. Therefore, the intake passage information detection sensor must be attached while at the same time correcting for any bend of the sealing member, and hence there is a problem in that the intake passage information detection sensor cannot be easily attached.

A second object of the present invention is to provide a throttle body to which the sealing member and the intake passage information detection sensor can be easily attached.

DISCLOSURE OF INVENTION

An electric parts attaching structure for a throttle body of the present invention is provided with: a throttle body having an intake passage in which a throttle valve is arranged, and a housing for accommodating electric parts formed on the outside thereof, an intake passage information detection sensor, which is attached to a bottom section of the housing, for detecting information in the intake passage, with connection pins extending therefrom; and a circuit board which is disposed on a side opposite to a side facing the bottom section of the housing, of the intake passage information detection sensor, has connection holes, and is attached to the housing in a state with the connection pins inserted into these connection holes.

According to the abovementioned electric parts attaching structure for a throttle body of the present invention, the intake passage information detection sensor is attached to the bottom section of the housing of the throttle body before attaching the circuit board, and subsequently, the circuit board can be attached to the housing while inserting the connection pins extending from the intake passage information detection sensor, into the connection holes, so that the circuit board is disposed on the side opposite to the side facing the bottom section, of the intake passage information detection sensor. Accordingly, since vision is not obstructed by the board when the intake passage information detection sensor is attached to the housing, the intake passage information detection sensor can be attached to the housing without imparting shocks to the intake passage information detection sensor.

As a result, the intake passage information detection sensor can be easily attached to the housing without any loss of reliability, and the above first object can be achieved.

Heat generating parts may be attached to the bottom section of the housing, and the circuit board may be disposed on the side opposite to the side facing the bottom section of the housing, of the heat generating parts, and may be attached to the housing in a state with connection pins extending from the heat generating parts inserted into connection holes.

In this case, the intake passage information detection sensor and the heat generating parts are attached to the bottom section of the housing of the throttle body before the circuit board. Subsequently, while inserting the connection pins extending from the intake passage information detection sensor and from the heat generating parts, into the connection holes, the circuit board can be attached to the housing so that it is disposed on the side of the intake passage information detection sensor and the heat generating parts, opposite to the side facing the bottom section of the housing. Accordingly, the heat generating parts can be isolated from the circuit board. Therefore, the influence of the heat generated by the heat generating parts on the circuit board can be reduced. As a result, reliability with respect to heat influence of parts mounted on the circuit board can be improved.

The intake passage information detection sensor and the heat generating parts may be arranged in diagonally opposite positions on the bottom section of the housing.

In this case, since the intake passage information detection sensor and the heat generating parts are disposed in diagonal positions on the bottom section of the housing, the intake passage information detection sensor can be distanced from the heat generating parts, and the influence of the heat generated by the heat generating parts on the intake passage information detection sensor can be reduced. As a result, the reliability with respect to heat influence of the intake passage information detection sensor can be improved.

Furthermore, by disposing the intake passage information detection sensor and the heat generating parts in diagonal positions on the bottom section of the housing, the circuit board becomes stable, and the assembly becomes easier, when attaching the circuit board while inserting the connection pins extending from the intake passage information detection sensor and the heat generating parts into the connection holes. As a result, the circuit board can be easily attached to the housing.

Attaching sections for the circuit board provided on the bottom section of the housing may be arranged next to the intake passage information detection sensor and the heat generating parts.

In this case, since the attaching sections for the circuit board are arranged next to the intake passage information detection sensor and the heat generating parts, the circuit board becomes more stable when attaching the circuit board, and assembly becomes easier. Therefore, attaching the circuit board to the housing becomes even easier.

An electric parts attaching method for a throttle body of the present invention wherein the throttle body has an intake passage in which a throttle valve is arranged, and has a housing for accommodating electric parts formed on the outside thereof, includes: attaching to a bottom section of the housing, an intake passage information detection sensor, which detects information of the inside of the intake passage; and attaching the circuit board to the housing while inserting connection pins extending from the intake passage information detection sensor into connection holes, so that the circuit board is arranged on a side of the intake passage information detection sensor opposite to a side facing the bottom section of the housing.

According to the abovementioned electric parts attaching method for a throttle body of the present invention, the intake passage information detection sensor is attached to the bottom section of the housing of the throttle body before attaching the circuit board, and subsequently, the circuit board can be attached to the housing while inserting the connection pins extending from the intake passage information detection sensor, into the connection holes, so that the circuit board is disposed on the side opposite to the side facing the bottom section of the housing, of the intake passage information detection sensor. Accordingly, since vision is not obstructed by the board when the intake passage information detection sensor is attached to the housing, the intake passage information detection sensor can be attached to the housing without imparting shocks to the intake passage information detection sensor. As a result, the intake passage information detection sensor can be easily attached to the housing without any loss of reliability, and the above first object can be achieved.

Heat generating parts may be attached to the bottom section of the housing, and the circuit board may be attached to the housing while inserting connection pins extending from the heat generating parts, into connection holes, so that the circuit board is arranged on a side of the heat generating parts opposite to a side facing the bottom section of the housing.

In this case, the intake passage information detection sensor and the heat generating parts are attached to the bottom section of the housing before the circuit board is attached, and subsequently, the circuit board can be attached to the housing while inserting the connection pins extending from the intake passage information detection sensor and from the heat generating parts, into the connection holes, so that the circuit board is disposed on the side of the intake passage information detection sensor and the heat generating parts opposite to the side facing the bottom section of the housing. Accordingly, since the heat generating parts can be isolated from the circuit board, the influence of the heat generated by the heat generating parts on the circuit board can be reduced. As a result, reliability with respect to heat influence of parts mounted on the circuit board can be improved.

The throttle body of the present invention is provided with: an intake passage in which a throttle valve is arranged; an insertion hole which communicates with this intake passage; an intake passage information detection sensor, which has in insertion section for inserting into the insertion hole, and which detects information of the inside of the intake passage; and a sealing member installed in a gap between an outer surface of the insertion section and an inner surface of the insertion hole.

According to the above throttle body, since the sealing member is installed in the gap between the outer surface of the insertion section of the intake passage information detection sensor and the inner surface of the insertion hole of the throttle body, the sealing member and the intake passage information detection sensor can be attached for example by just pre-fitting the sealing member to the outer surface of the insertion section, and inserting the insertion section in this state into the insertion hole together with the sealing member. Therefore, the sealing member and the intake passage information detection sensor can be easily attached, and hence the above second object can be achieved. In addition, since dimensional errors of the insertion hole can be absorbed due to deformation of the sealing member, a tolerance range of the accuracy of the insertion hole can be widened, and processing becomes easier.

The above sealing member may have a cylinder shape with a corrugated outer surface formed thereon.

In this case, the sealing member is pre-fitted to the outer surface of the insertion section, and in the case where in this state the insertion section is inserted into the insertion hole together with the sealing member, it can be easily inserted into the insertion hole due to the corrugated part of the sealing member. Furthermore, in the case where the intake passage information detection sensor is embedded in resin potting, even if the potting resin enters into the gap between the sealing member and the insertion hole, the potting resin can be accommodated in the space formed between the valley side of the corrugations and the insertion hole. Therefore, the potting resin can be prevented from flowing around from the tip end of the insertion section to the detection section side.

A tip end side of the insertion section may project from the sealing member.

In this case, since the tip end side of the insertion section projects from the sealing member, in the case where the intake passage information detection sensor is embedded in the resin potting, even if the potting resin enters into the gap between the sealing member and the insertion hole, the potting resin can be accommodated in the space between the outer surface of the insertion section tip end side and the inner surface of the insertion hole. Therefore, the potting resin can be prevented from flowing around from the insertion section tip end side to the detection section side.

The intake passage information detection sensor may be embedded in a resin potting.

In this case, since the intake passage information detection sensor is embedded in the resin potting, the sealing member reliably seals the resin potting.

BEST MODE FOR CARRYING OUT THE INVENTION (Electric Parts Attaching Structure for a Throttle Body, and Attaching Method Thereof)

One embodiment of an electric parts attaching structure for a throttle body and an attaching method for a throttle body of the present invention is described hereunder, with reference to the figures.

A modularized throttle body assembly 13 is described, in which an engine control unit (electronic control unit) 11 used in the present embodiment is integrally built into a throttle body 12.

Figure 1:
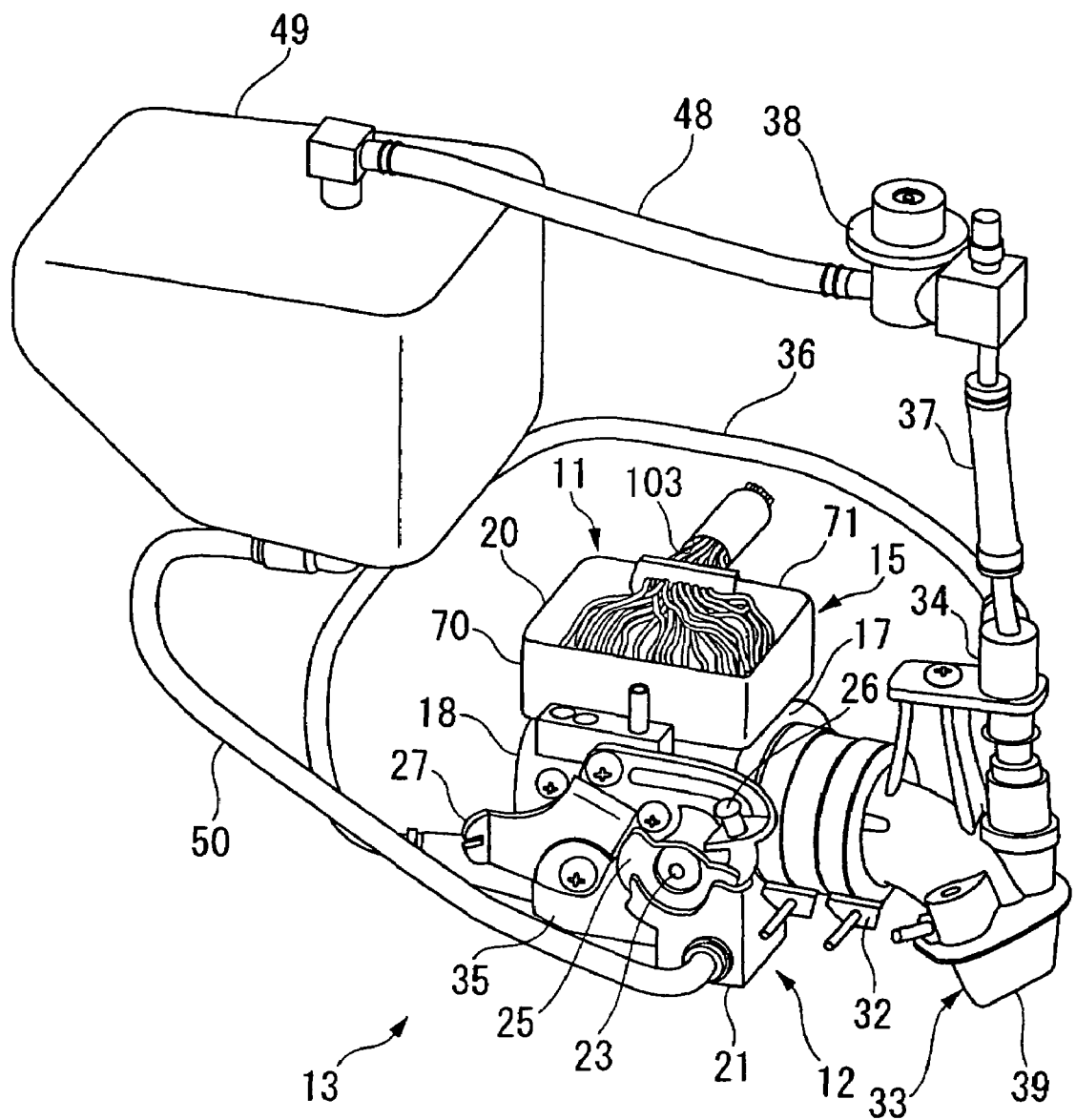
FIG. 1 is a perspective view showing one embodiment of a throttle body assembly to which an electric parts attaching structure for a throttle body and an attaching method thereof of the present invention have been applied.
Figure 2:
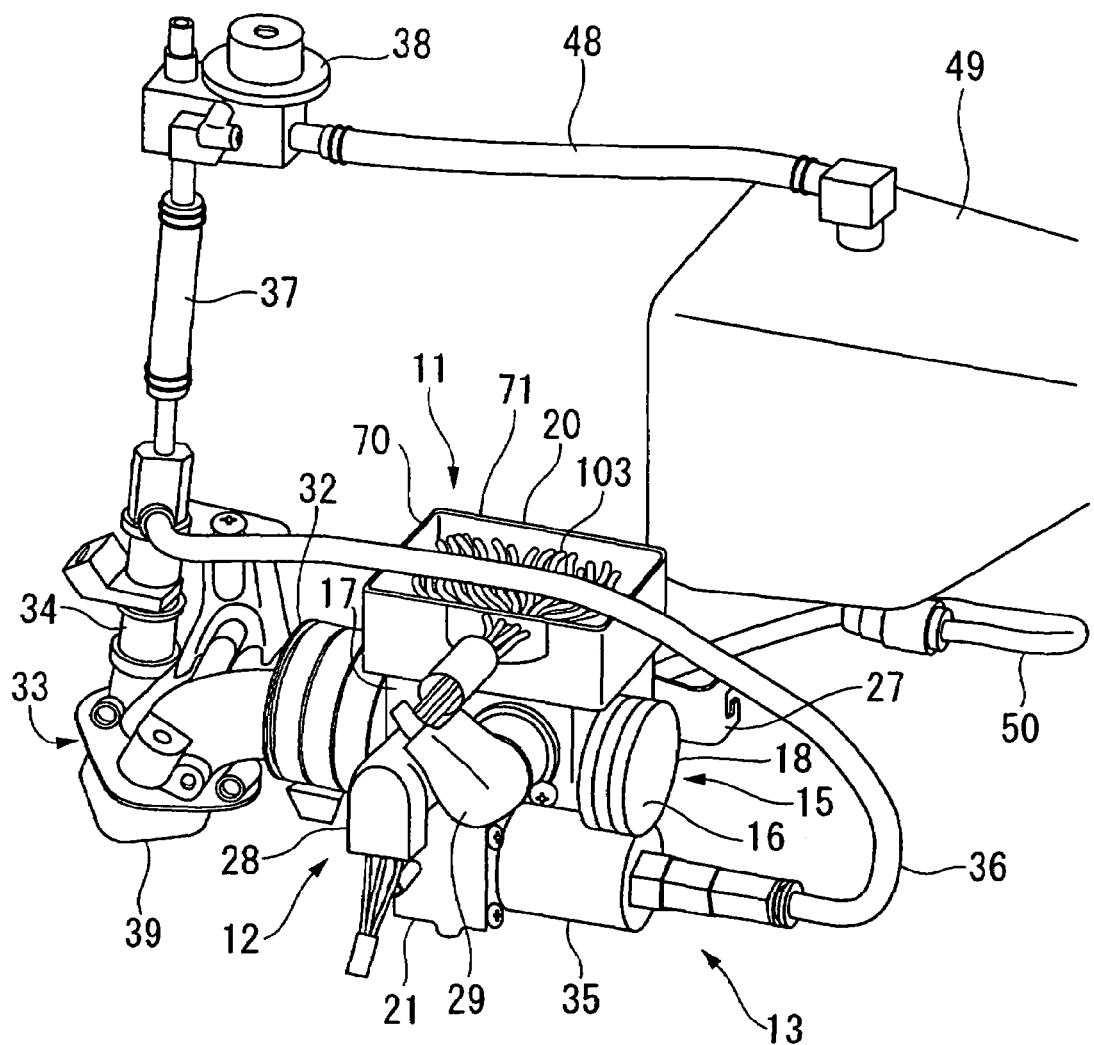
FIG. 2 is a perspective view of the throttle body assembly seen from another direction.
Figure 4:
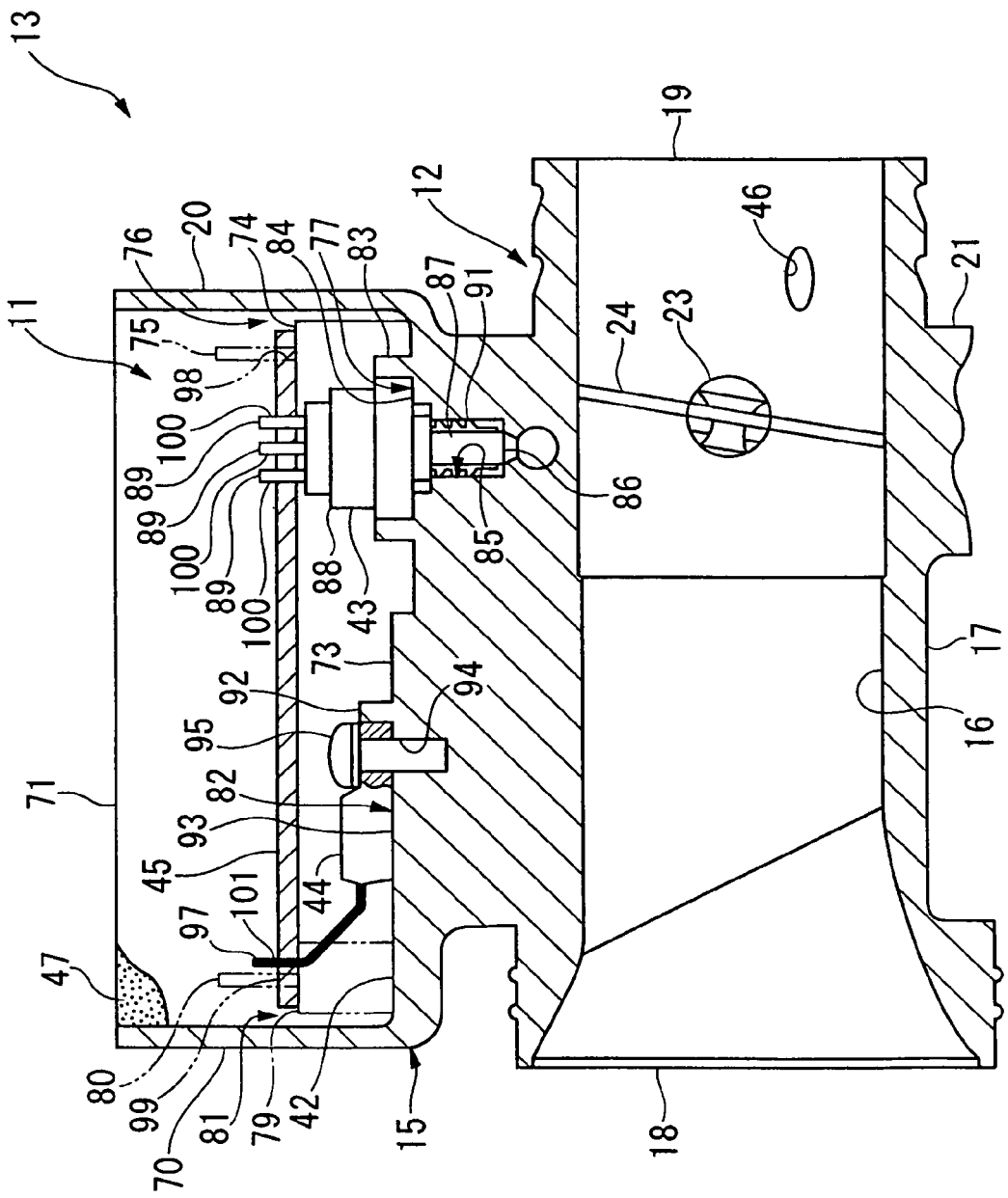
FIG. 4 is a sectional view showing the throttle body and the electronic control unit.

The throttle body assembly 13 shown in FIG. 1 and FIG. 2 is to be mounted on, for example, a motorcycle, and has a throttle body base 15. As shown in FIG. 4, the throttle body base 15 is integrally formed from a metal such as aluminum and has: an approximately stepped cylinder shaped intake passage forming section 17 inside of which is formed an intake passage 16 having a circular axi-orthogonal cross-section and extended in one direction as shown in FIG. 4; a cylinder shaped inlet side duct section 18 formed on one end side in the extending direction of the intake passage 16 of the intake passage forming section 17; a cylinder shaped outlet side duct section 19 formed on the other end side of the intake passage forming section 17; a housing 20 for accommodating electric parts, which is formed outside of the throttle body 12 and on a top side of the intake passage forming section 17, and which has an opening on the side opposite to the intake passage forming section 17; and a fuel pump attaching section 21 provided on a bottom side of the intake passage forming section 17.

A throttle valve 24, which rotates about a rotation shaft 23 so as to open and close the intake passage 16, is provided in the intake passage 16 of the throttle body base 15, of the throttle body assembly 13. On a side part of the throttle body base 15, as shown in FIG. 1, there is provided a rotation member 25 which is joined to the rotation shaft 23 on the same axis and is rotated by a throttle wire (not shown in the figures), and a stopper member 27 which supports the throttle wire and adjusts the rotation limit position of the rotation member 25 with an adjustment screw 26.

Furthermore, in the throttle body assembly 13, as shown in FIG. 2, a throttle opening sensor 28 which detects the opening of the throttle valve 24 by detecting a rotation angle of the rotation shaft 23, is provided on the side of the throttle body base 15 opposite to the side where the rotation member 25 is located. Moreover, a secondary air supply unit 29 is provided alongside of this throttle opening sensor 28.

The throttle body 12 includes, as the main components, the throttle body base 15, the throttle valve 24, the rotation member 25, the stopper member 27, the throttle opening sensor 28, and the secondary air supply unit 29.

The throttle body assembly 13 is provided with: a connection tube 32 (refer to FIG. 1 and FIG. 2) connected to the outlet side duct section 19 (refer to FIG. 4) of the intake passage section 17 of the throttle body base 15; an intake manifold 33 which communicates with the intake passage 16 of the intake passage forming section 17 by being connected to the outlet side duct section 19 of the intake passage forming section 17 through this connection tube 32, and inside of which is formed the intake passage 16; an injector 34 which is attached to the intake manifold 33 and which injects fuel into the intake passage; a fuel pump 35 which is attached to the fuel pump attaching section 21 of the throttle body base 15, and supplies fuel to the injector 34; a pipe line 36 which connects between the injector 34 and the fuel pump 35; a pipe line 37 connected to the injector 34; and a relief valve 38 connected to the pipe line 37. The intake manifold 33 is bent at a point part way along its length so that an engine attaching section 39 provided on the opposite side to the throttle body 12 faces downward.

Figure 3:
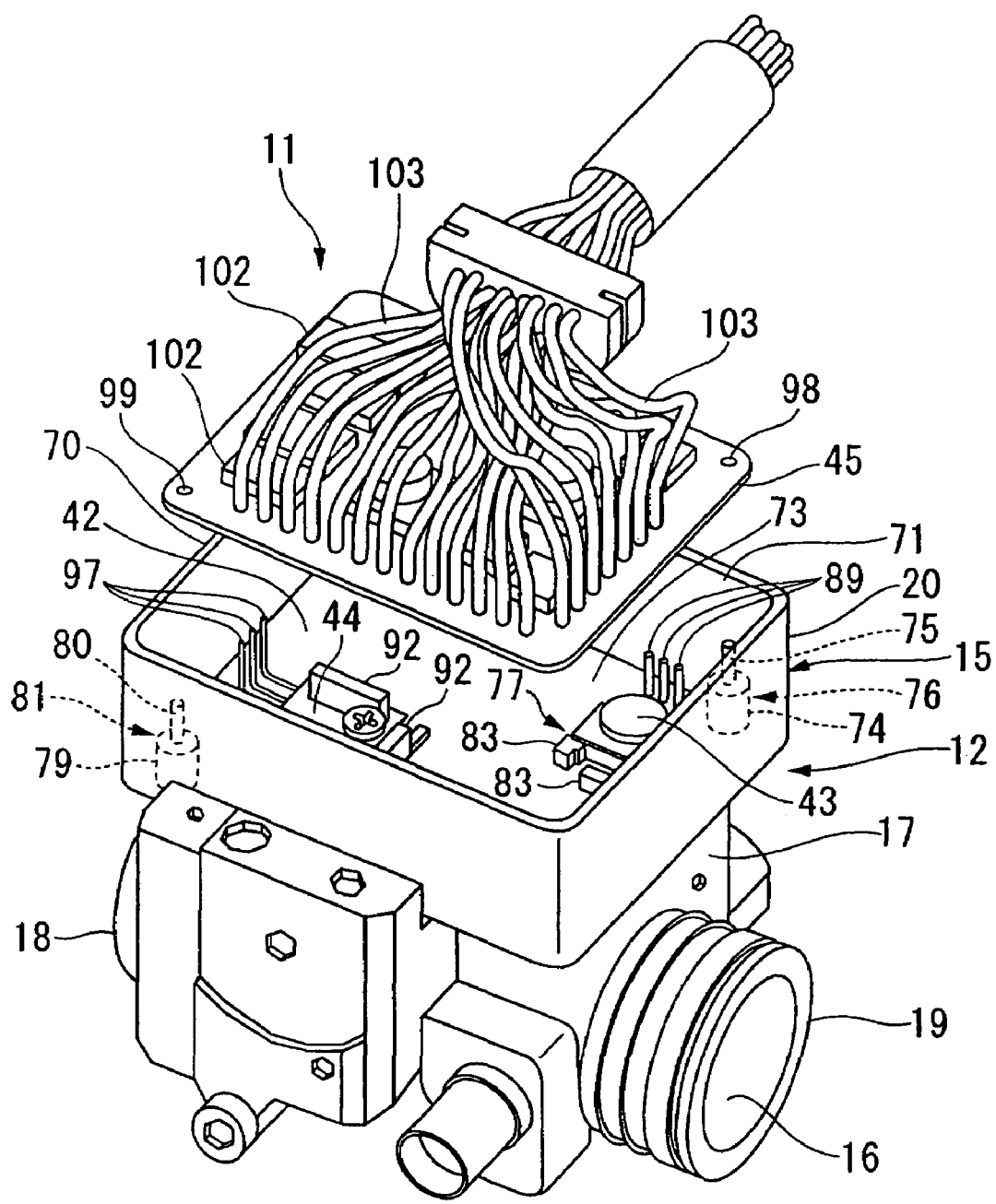
FIG. 3 is an exploded perspective view showing the throttle body and an electronic control unit.

Furthermore, as shown in FIG. 3 and FIG. 4, the throttle body assembly 13 has an intake air pressure sensor 43 (electric part, intake passage information detection sensor), and a power transistor 44 (electric part, heat generating part), both of which are attached to a bottom section 42 of the housing 20.

The intake air pressure sensor 43 is connected to a circuit board (electric part) 45 which is accommodated in the housing 20, and detects the pressure, which is interior information of the intake passage 16, via an aperture section 46 (refer to FIG. 4) which opens to the intake manifold 33 side of the throttle valve 24 in the intake passage 16.

The power transistor 44 is connected to the circuit board 45 accommodated in the housing 20, and constitutes the engine control unit 11 (so called ECU) which electronically controls the engine, together with the circuit board 45.

Moreover, resin potting in which resin 47 is filled in a gap as partially shown in FIG. 4, is carried out on the housing 20 in a condition with the circuit board 45 accommodated therein. Then, the circuit board 45, the intake air pressure sensor 43, and the power transistor 44 are also embedded in this potting resin 47.

In the above described throttle body assembly 13, as shown in FIG. 1 and FIG. 2, the relief valve 38 is connected to a fuel tank 49 via a pipe line 48, and the fuel pump attaching section 21 is connected to the fuel tank 49 via a pipe line 50. As a result, the fuel pump 35 sucks in fuel from the fuel tank 49 through the pipe line 50, and supplies the fuel to the injector 34 through the pipe line 36.

Figure 5:
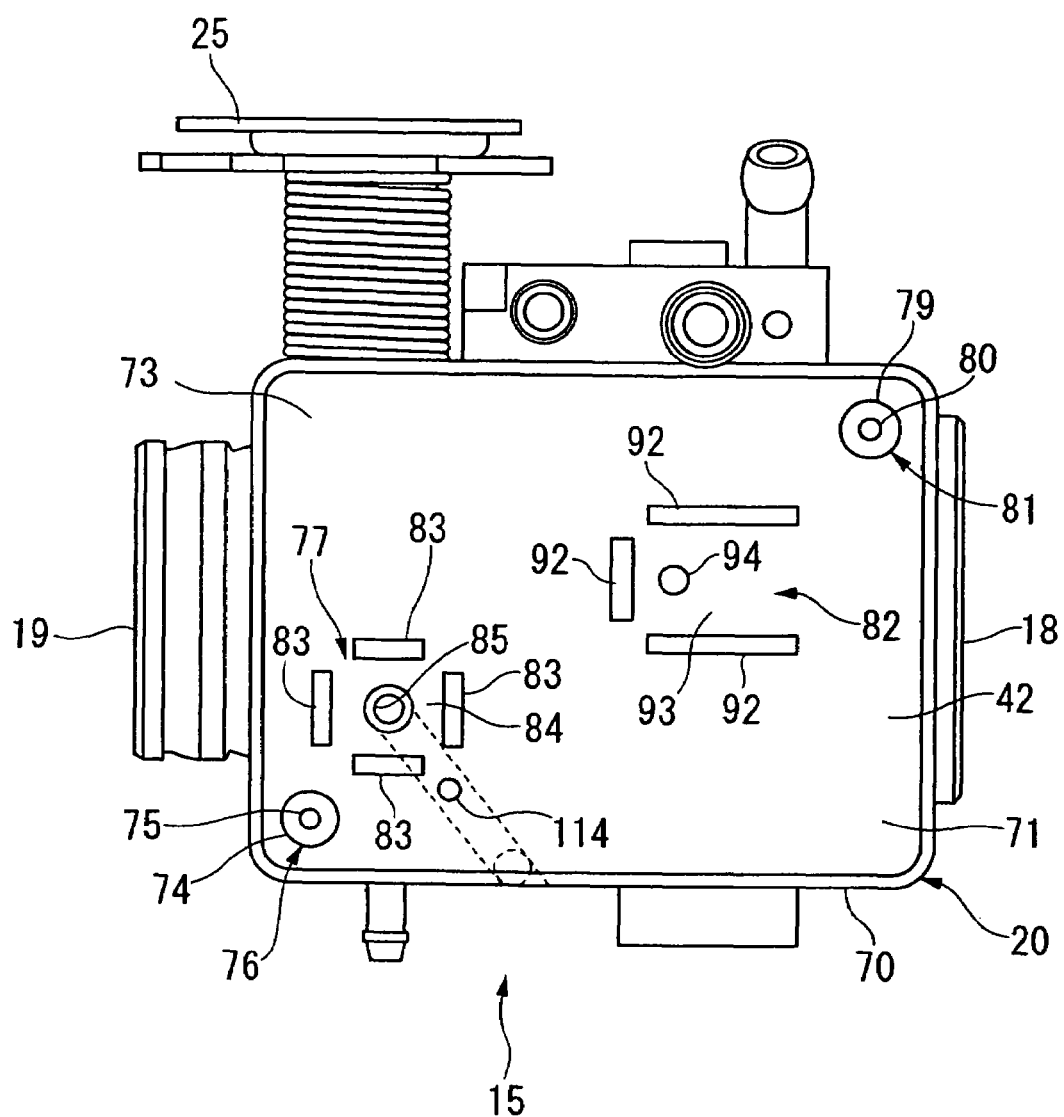
FIG. 5 is a plan view showing the throttle body and the electronic control unit.

The housing 20 formed above the throttle body 12 has a rectangle shaped bottom section 42, and wall sections 70 which are provided in an upright rectangle casing shape on the four peripheral edges of the bottom section 42, and has an opening section 71 at the top of the housing 20. Moreover, on a corner of the rectangle shaped bottom section 42, more specifically, on the corner on the outlet side duct section 19 side and the throttle opening sensor 28 side, as shown in FIG. 3 to FIG. 5, a mounting stand 74 for mounting the circuit board 45, which projects from a bottom section 73 to the opening section 71 side, is integrally formed, and an insertion pin 75 which projects to the opening section 71 side, is provided on this mounting stand 74, thereby constructing a board attaching section (attaching section) 76 for the circuit board 45. Moreover, a sensor attaching section 77 to which the intake air pressure sensor 43 is attached, is formed in the proximity of the board attaching section 76 of the bottom section 73.

In addition, on a corner positioned diagonal to the aforementioned corner of the bottom section 42, more specifically, on the corner on the inlet side duct section 18 side and the rotation member 25 side, as shown in FIG. 3 to FIG. 5, a mounting stand 79 for mounting the circuit board 45, which projects from the bottom section 73 to the opening section 71 side is also integrally formed. An insertion pin 80, which projects to the opening section 71 side, is provided on this mounting stand 79, thereby constructing a board attaching section (attaching section) 81 for the circuit board 45. A parts attaching section 82 to which the power transistor 44 is attached, is formed in the proximity of the board attaching section 81 of the bottom section 73. As a result, the sensor attaching section 77 and the parts attaching section 82 are formed on diagonal positions on the bottom section 42.

The sensor attaching section 77 has a positioning section 84 which is surrounded by a wall section 83, and is thus formed on the bottom section 73, and an insertion passage hole 85 bored into this positioning section 84. The insertion passage hole 85 communicates with the aperture section 46, which opens to the intake manifold 33 side with respect to the throttle valve 24, of the intake passage 16.

As shown in FIG. 4, the intake air pressure sensor 43 has a shaft shaped insertion section 87 which is inserted into the insertion passage hole 85, and whose tip end surface is a detection section 86, and a sensor body section 88 which is positioned with respect to the housing 20, by being mounted in the positioning section 84 so that the insertion section 87 is inserted into the insertion passage hole 85. A plurality of connection pins 89 which extend in the direction opposite to that of the insertion section 87, are provided (specifically at three places) on the sensor body section 88. A cylinder shaped sealing member 91 is installed in a gap between the outer surface of the insertion section 87 and the inner surface of the insertion passage hole 85. This sealing member 91 is inserted into the insertion passage hole 85 together with the insertion section 87, in a state of having been pre-engaged with the insertion section 87.

The parts attaching section 82 has a positioning section 93 which is surrounded by a wall section 92 and is formed on the bottom section 73, and a screw hole 94 formed in this positioning section 93.

The power transistor 44 is positioned in the housing 20 by being mounted inside the positioning section 93. In this positioned state, by screwing an attaching screw 95 into the screw hole 94 through the power transistor 44, the power transistor 44 is attached so that it directly contacts with the housing 20 (in other words, is directly attached). As shown in FIG. 3, a plurality of connection pins 97 which extend to the opening section 71 side in this attached state, are formed (specifically at three places) on the power transistor 44.

Electric parts 102, external connection wiring 103, and so forth, are pre-mounted on the circuit board 45. A guide hole 98 for insertion of the insertion pin 75, and a guide hole 99 for insertion of the insertion pin 80, are formed in diagonally opposite positions on the rectangular circuit board 45. As shown in FIG. 4, on the circuit board 45 in the proximity of the one guide hole 98, connection holes 100 for insertion of the connection pins 89 of the intake air pressure sensor 43 attached to the housing 20 are formed numbering as many as the number of the connection pins 89. In the position in the proximity of the other guide hole 99, connection holes 101 for insertion of the connection pins 97 of the power transistor 44 attached to the housing 20 are formed numbering as many as the number of the connection pins 97.

Next, a method of attaching the above described intake air pressure sensor 43, power transistor 44 and circuit board 45, to the throttle body 12 is described.

The intake air pressure sensor 43 is attached to the sensor attaching section 77 of the bottom section 42 of the housing 20, in a state in which the sealing member 91 is engaged with the insertion section 87. In other words, the sensor body section 88 is fitted into the positioning section 84, while the insertion section 87 to which the sealing member 91 is attached, is engaged in the insertion passage hole 85. As a result the intake air pressure sensor 43 is attached to the sensor attaching section 77, and the intake air pressure sensor 43 is positioned with respect to the housing 20. Moreover, the intake air pressure sensor 43 is maintained in a state where it is temporarily fixed to the housing 20 due to the fitting force of the sealing member 91 on the insertion passage hole 85.

Moreover, in conjunction with this, the power transistor 44 is attached to the parts attaching section 82. In other words, after the power transistor 44 has been fitted to the positioning section 93, it is fixed by the attaching screw 95. As a result, the power transistor 44 is positioned with respect to the housing 20.

Either one of the intake air pressure sensor 43 or the power transistor 44 may be attached first.

Accordingly, the intake air pressure sensor 43 and the power transistor 44 attached to the housing 20 are arranged in diagonal positions on the bottom section 42 of the housing 20. Also, the board attaching section 76 for the circuit board 45 provided on the bottom section 42 is arranged adjacent to the intake air pressure sensor 43, and the board attaching section 81 is arranged adjacent to the power transistor 44.

The circuit board 45 is attached to the housing 20, to which the intake air pressure sensor 43 and the power transistor 44 are attached as described above. In other words, the insertion pins 75 and 80 of both the board attaching sections 76 and 81 of the housing 20 are inserted into both the guide holes 98 and 99, which are in diagonally opposite positions on the circuit board 45. Subsequently, when the circuit board 45 is moved further toward the mounting stands 74 and 79 side, that is, toward the bottom section 73, the connection pins 89 of the intake air pressure sensor 43 are inserted into the connection holes 100 formed in the circuit board 45, and the connection pins 97 of the power transistor 44 are inserted into the connection holes 101 formed in the circuit board 45. At this time, the circuit board 45 is guided by the insertion pins 75 and 80 so that the connection pins 89 and 97 are positioned and inserted smoothly into all the connection holes 100 and 101. Subsequently, the circuit board 45 is mounted on both of the mounting stands 74 and 79.

Next, the connection pins 89 and 97 which project from the circuit board 45 to the opening section 71 side, are connected to the circuit board 45 by means of soldering or the like.

Moreover, by carrying out resin potting into the housing 20, which is in the state of accommodating the circuit board 45, up to the level of the opening section 71, the circuit board 45, the intake air pressure sensor 43, and the power transistor 44 are embedded in the potting resin 47. As a result, the circuit board 45, in the state of being mounted on both the mounting stands 74 and 79, is attached to both the board attaching sections 76 and 81 (specifically, it is attached to the housing 20).

As described above, the intake air pressure sensor 43 is attached to the bottom section 42 of the housing 20 of the throttle body 12, and the circuit board 45 is attached to the housing 20, being disposed on the side of the intake air pressure sensor 43 opposite to the side facing the bottom section 42, and furthermore, in a condition with the connection pins 89 extending from the intake air pressure sensor 43 inserted into the connection holes 100. Moreover, the power transistor 44, which is a heat generating part, is attached to the bottom section 42 of the housing 20, and the circuit board 45 is attached to the housing 20, being disposed on the side of the power transistor 44 opposite to the side facing the bottom section 42, and furthermore, in a condition with the connection pins 97 extending from the power transistor 44 inserted into the connection holes 101.

According to the present embodiment described above, the intake air pressure sensor 43 and the power transistor 44 can be attached to the bottom section 42 of the housing 20 of the throttle body 12 before the circuit board 45 is attached. Subsequently, the circuit board 45 can be attached to the housing 20 so that the circuit board 45 is disposed on the side of the intake air pressure sensor 43 and the power transistor 44 opposite to the side facing the bottom section 42, while inserting the connection pins 89 extending from the intake air pressure sensor 43 into the connection holes 100, and the connection pins 97 extending from the power transistor 44 into the connection holes 101. Accordingly, since vision is not obstructed by the circuit board 45 at the time when the intake air pressure sensor 43 is being attached to the housing 20, the intake air pressure sensor 43 can be attached to the housing 20 without imparting shocks to the intake air pressure sensor 43. Consequently, the intake air pressure sensor 43 can be easily attached to the housing 20 without any loss of reliability.

Furthermore, due to the above arrangement, the power transistor 44 can be distanced from the circuit board 45. Therefore, influence of the heat generated by the power transistor 44 on the circuit board 45 can be reduced. As a result, the reliability of parts mounted on the circuit board 45 with respect to heat influence can be improved.

In addition, since the intake air pressure sensor 43 and the power transistor 44 are disposed in diagonally opposite positions on the bottom section 42 of the housing 20, the intake air pressure sensor 43 can be distanced from the power transistor 44, and influence of the heat from the power transistor 44 on the intake air pressure sensor 43 can be reduced. As a result, the reliability of the intake air pressure sensor 43 with respect to heat influence can be improved.

Furthermore, by disposing the intake air pressure sensor 43 and the power transistor 44 in diagonally opposite positions on the bottom section 42 of the housing 20, the circuit board 45 becomes more stable and it becomes easier to assemble when attaching the circuit board 45 while inserting the connection pins 89 and 97 extending from the intake air pressure sensor 43 and the power transistor 44, into the connection holes 100 and 101. As a result, the circuit board 45 can be more easily attached to the housing 20.

In addition, since the board attaching sections 76 and 81 of the circuit board 45 are arranged next to the intake air pressure sensor 43 and the power transistor 44, on the bottom section 42, the circuit board 45 becomes more stable, and easier to assemble when attaching the circuit board 45. As a result, attaching the circuit board 45 to the housing 20 can be made even easier.

Other than the intake air pressure sensor, the present invention is also applicable in the case of providing various kinds of intake passage information detection sensors for detecting information in the intake passage 16, such as a flow rate sensor for detecting the flow rate in the intake passage 16.

(Throttle Body)

Hereinafter, one embodiment of the throttle body of the present invention is described with reference to the drawings.

With reference to FIG. 6 to FIG. 10, a description is given of a throttle body assembly 13A which has been modularized by integrally assembling an engine control unit 11A (control unit) into a throttle body 12A to which the present embodiment is applied.

Figure 6:
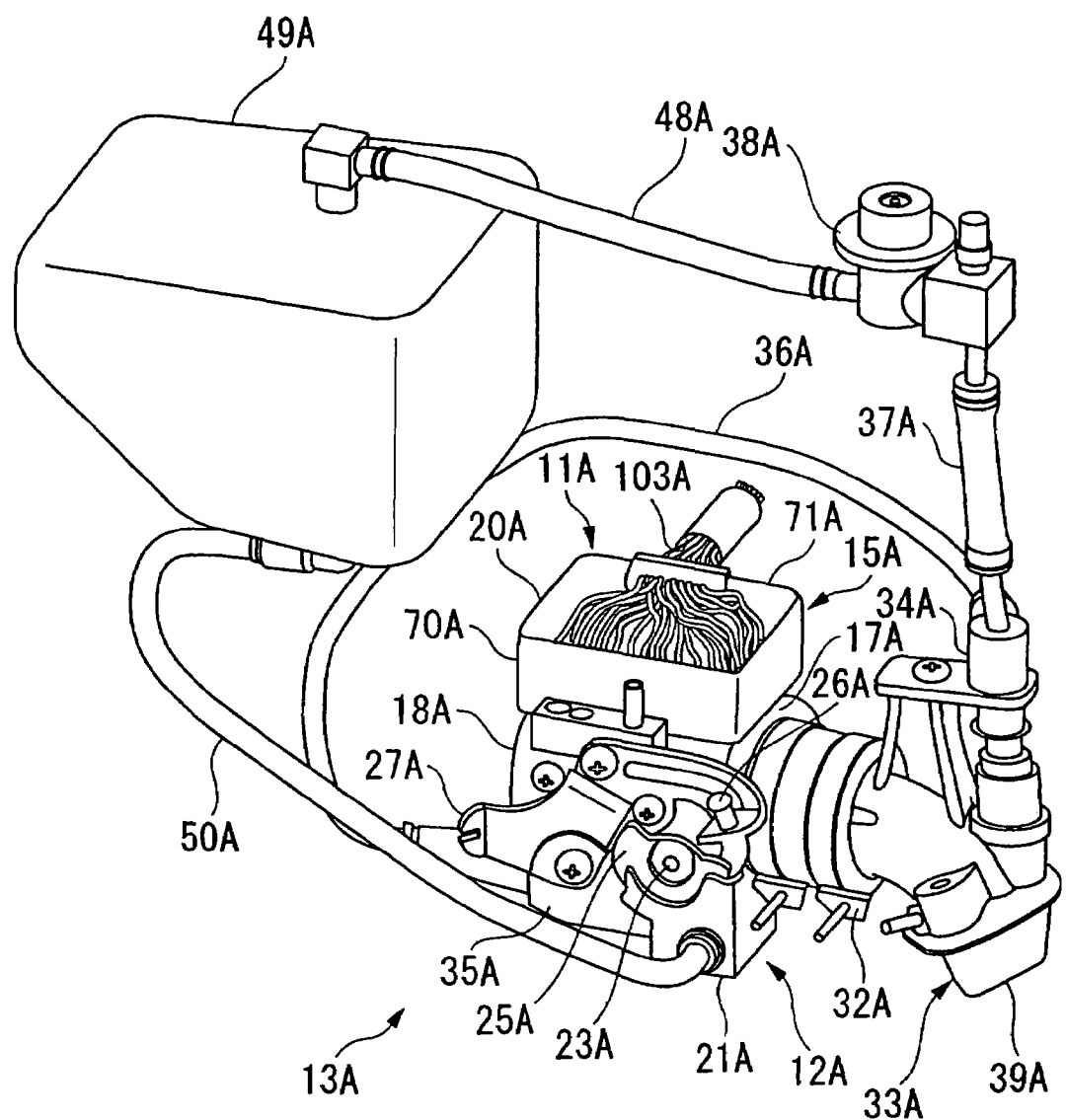
FIG. 6 is a perspective view showing the throttle body assembly provided with the throttle body of the present invention.
Figure 7:
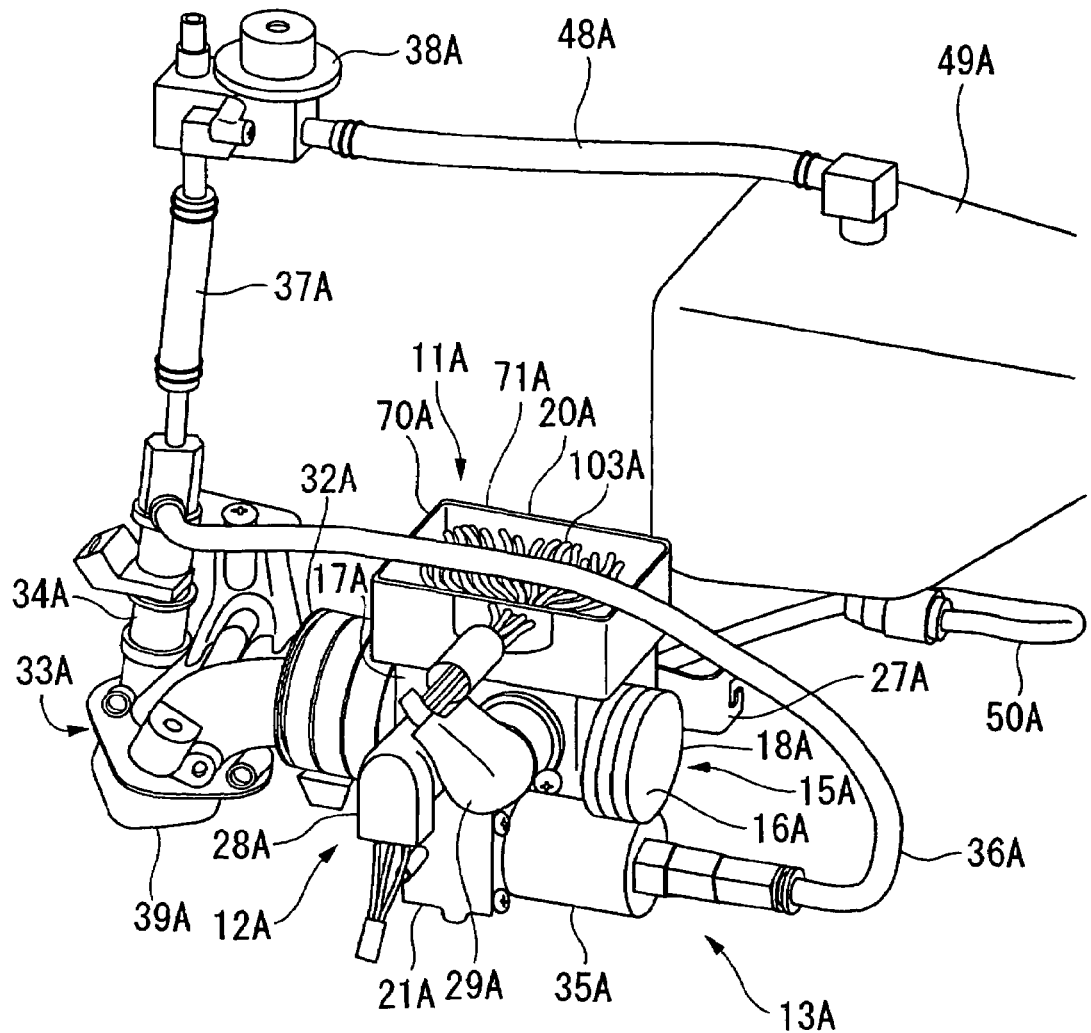
FIG. 7 is a perspective view of the throttle body assembly seen from another direction.
Figure 9:
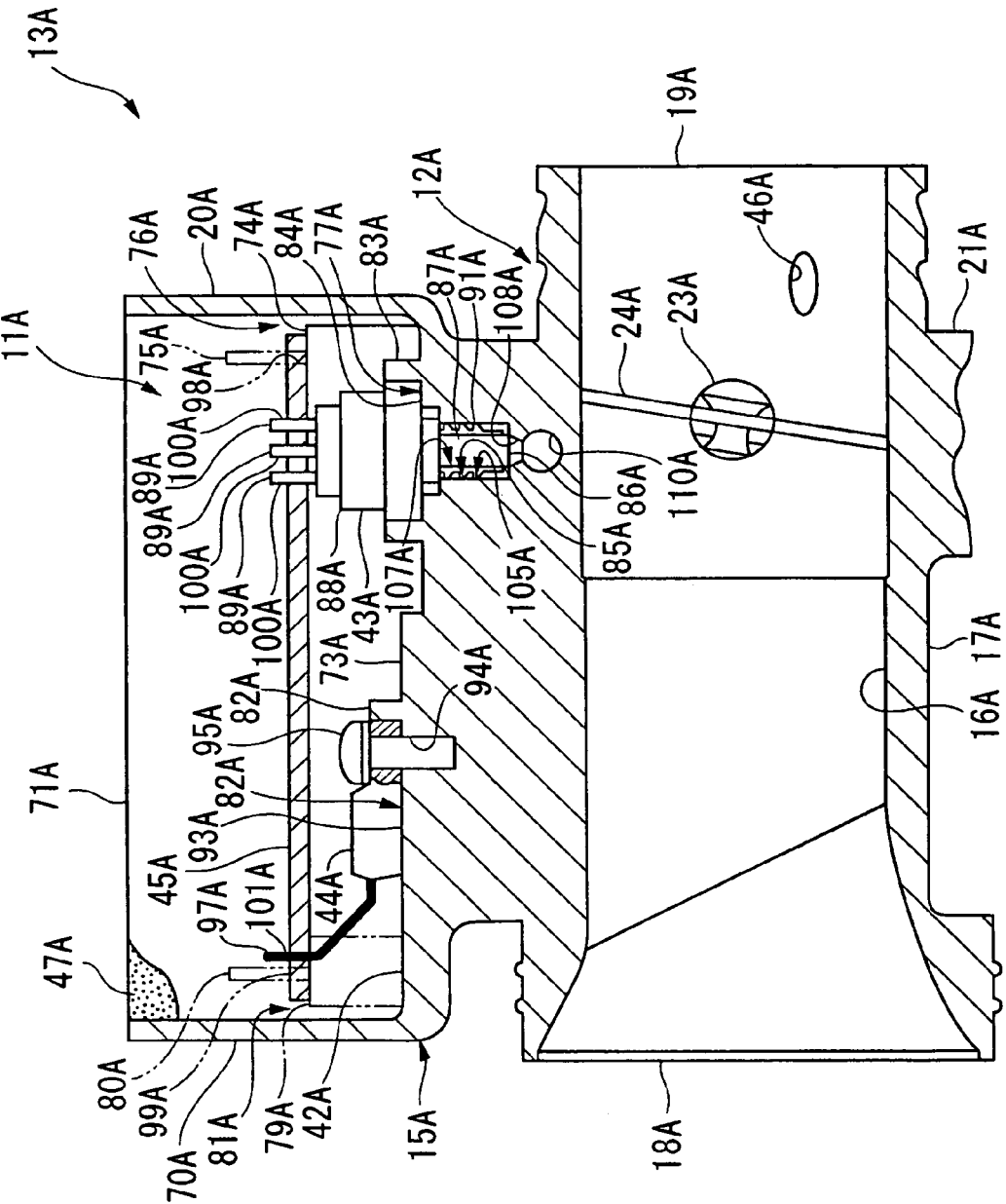
FIG. 9 is a sectional view of the throttle body assembly.

The throttle body assembly 13A shown in FIG. 6 and FIG. 7 is to be mounted on, for example, a motorcycle, and has a throttle body base 15A. The throttle body base 15A is integrally formed from a metal such as aluminum and has: an approximately stepped cylinder shaped intake passage forming section 17A inside of which is formed an intake passage 16A having a circular axi-orthogonal cross-section and extended in one direction as shown in FIG. 9; a cylinder shaped inlet side duct section 18A formed on one end side in the extending direction of the intake passage 16A of the intake passage forming section 17A; a cylinder shaped outlet side duct section 19A formed on the other end side of the intake passage forming section 17A; a housing 20A for accommodating electric parts, which is formed outside of the throttle body 12A and on a top side of the intake passage forming section 17A, and which has an opening on the side opposite to the intake passage forming section 17A; and a fuel pump attaching section 21A provided on a bottom side of the intake passage forming section 17A.

Moreover, a throttle valve 24A, which rotates about a rotation shaft 23A so as to open and close the intake passage 16A, is provided in the intake passage 16A of the throttle body base 15A, in the throttle body assembly 13A. On a side part of the throttle body base 15A, as shown in FIG. 6, there is provided a rotation member 25A which is joined to the rotation shaft 23A on the same axis and is rotated by a throttle wire (not shown in the figures), and a stopper member 27A which supports the throttle wire and adjusts the rotation limit position of the rotation member 25A with an adjustment screw 26A.

Furthermore, in the throttle body assembly 13A, as shown in FIG. 7, a throttle opening sensor 28A which detects the opening of the throttle valve 24A by detecting a rotation angle of the rotation shaft 23A, is provided on the side of the throttle body base 15A opposite to the side where the rotation member 25A is located. Moreover, a secondary air supply unit 29A is provided alongside of this throttle opening sensor 28A.

Here, the throttle body 12A includes, as the main components, the throttle body base 15A, the throttle valve 24A, the rotation member 25A, the stopper member 27A, the throttle opening sensor 28A, and the secondary air supply unit 29A.

The throttle body assembly 13A is provided with: a connection tube 32A (refer to FIG. 6 and FIG. 7) connected to the outlet side duct section 19A (refer to FIG. 9) of the intake passage section 17A of the throttle body base 15A; an intake manifold 33A which communicates with the intake passage 16A of the intake passage forming section 17A by being connected to the outlet side duct section 19A of the intake passage forming section 17A through this connection tube 32A, and inside of which is formed the intake passage 16A; an injector 34A which is attached to the intake manifold 33A and which injects fuel into the intake passage; a fuel pump 35A which is attached to the fuel pump attaching section 21A of the throttle body base 15A, and supplies fuel to the injector 34A; a pipe line 36A which connects between the injector 34A and the fuel pump 35A; a pipe line 37A connected to the injector 34A; and a relief valve 38A connected to the pipe line 37A. Moreover, the intake manifold 33A is bent at a point on a way along its length so that an engine attaching section 39A provided on the opposite side to the throttle body 12A faces downward.

Figure 8:
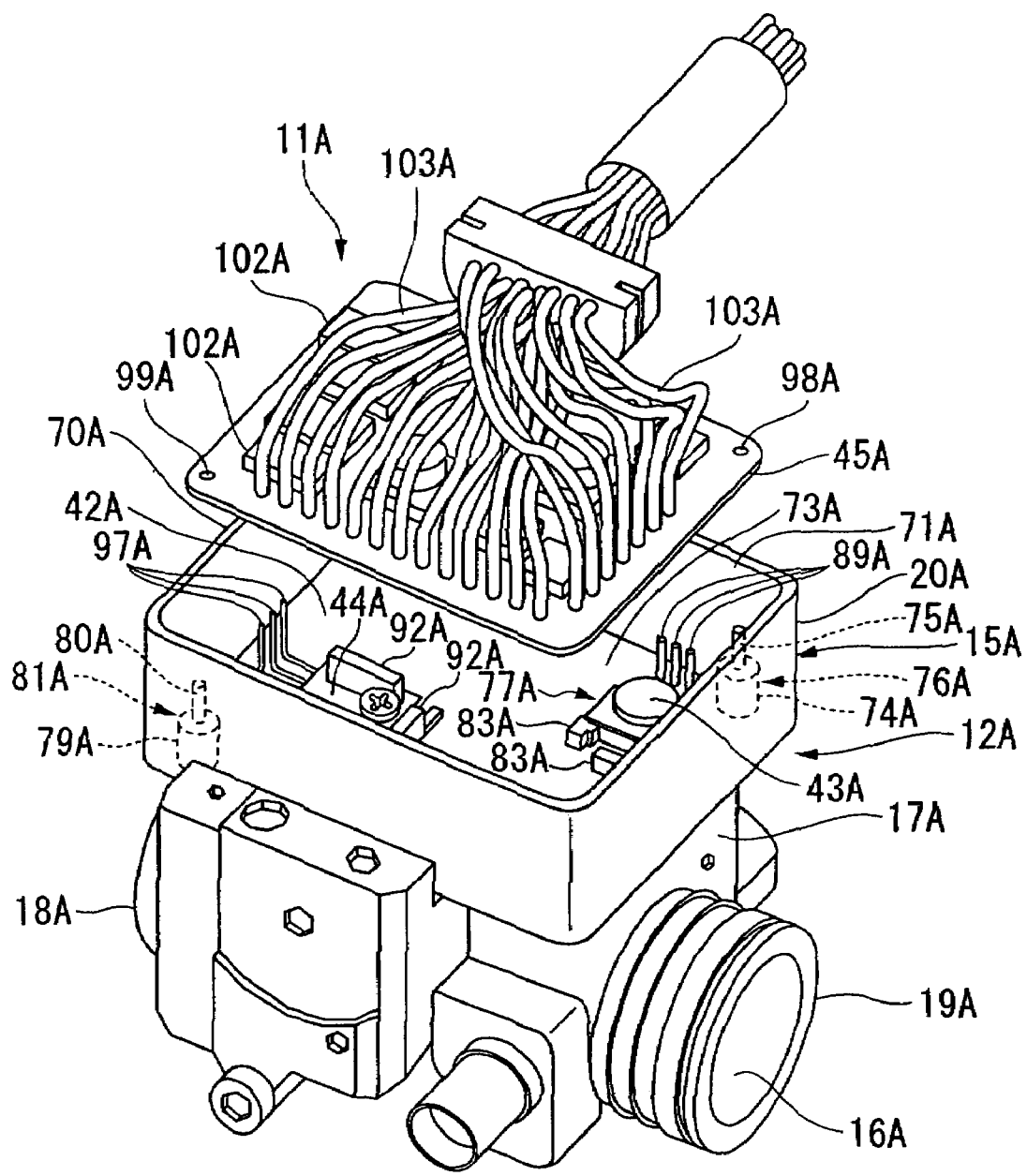
FIG. 8 is an exploded perspective view of the throttle body assembly.

Furthermore, as shown in FIG. 8 and FIG. 9, the throttle body assembly 13A has an intake air pressure sensor 43A (electric part, intake passage information detection sensor), and a power transistor 44A (electric part, heat generating part), both of which are attached to a bottom section 42A of the housing 20A.

The intake air pressure sensor 43A is connected to a circuit board (electric part) 45A which is accommodated in the housing 20A, and detects the pressure, which is interior information of the intake passage 16A, via an aperture section 46A (refer to FIG. 9) which opens to the intake manifold 33A side of the throttle valve 24A in the intake passage 16A.

The power transistor 44A is connected to the circuit board 45A accommodated in the housing 20A, and constitutes the engine control unit 11A (so called ECU) which electronically controls the engine, together with the circuit board 45A.

Resin potting in which resin 47A is filled in a gap as partially shown in FIG. 9, is carried out on the housing 20A in a condition with the circuit board 45A accommodated therein. Then, the circuit board 45A, the intake air pressure sensor 43A, and the power transistor 44A are also embedded in this potting resin 47A.

In the above described throttle body assembly 13A, as shown in FIG. 6 and FIG. 7, the relief valve 38A is connected to a fuel tank 49A via a pipe line 48A, and the fuel pump attaching section 21A is connected to the fuel tank 49A via a pipe line 50A respectively. As a result, the fuel pump 35A sucks in fuel from the fuel tank 49A through the pipe line 50A, and supplies the fuel to the injector 34A through the pipe line 36A.

Figure 10:
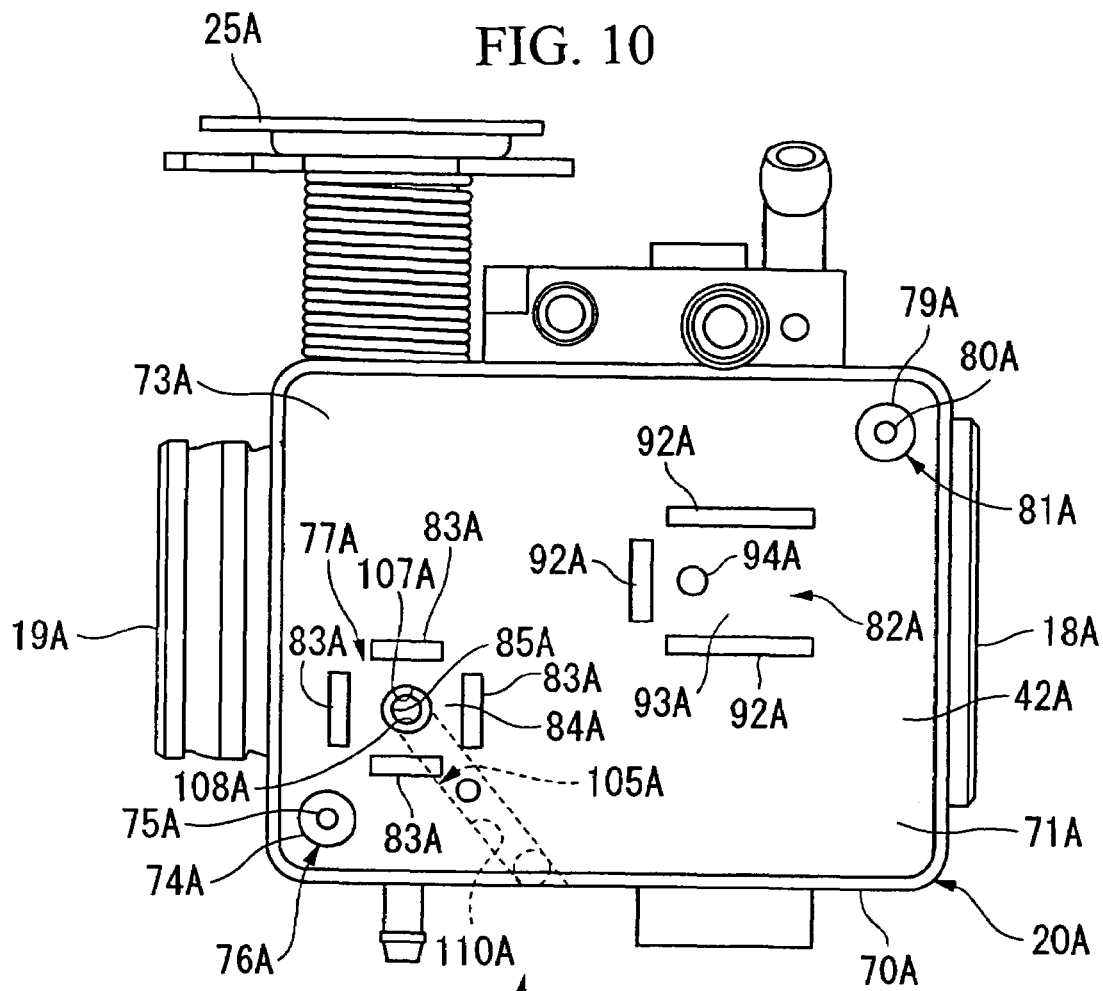
FIG. 10 is a plan view of the throttle body assembly.

The housing 20A formed above the throttle body 12A is formed in a shape having a rectangle shaped bottom section 42A, and wall sections 70A which are provided in an upright rectangle casing shape on the four peripheral edges of the bottom section 42A, and has an opening section 71A at the top of the housing 20A. Moreover, on a corner of the rectangle shaped bottom section 42A, more specifically, on the corner on the outlet side duct section 19A side and the throttle opening sensor 28A side, as shown in FIG. 8 to FIG. 10, a mounting stand 74A for mounting the circuit board 45A, which projects from a bottom section 73A to the opening section 71A side, is integrally formed, and an insertion pin 75A which projects to the opening section 71A side, is provided on this mounting stand 74A, thereby constructing a board attaching section 76A for the circuit board 45A. Moreover, a sensor attaching section 77A to which the intake air pressure sensor 43A is attached, is formed in the proximity of the board attaching section 76A of the bottom section 73A.

In addition, on a corner positioned diagonal to the aforementioned corner of the bottom section 42A, more specifically, on the corner on the inlet side duct section 18A side and the rotation member 25A side, as shown in FIG. 8 to FIG. 10, a mounting stand 79A for mounting the circuit board 45A, which projects from the bottom section 73A to the opening section 71A side is also integrally formed. An insertion pin 80A, which projects to the opening section 71A side, is provided on this mounting stand 79A, thereby constructing a board attaching section 81 for the circuit board 45A. Moreover, a parts attaching section 82A to which the power transistor 44A is attached, is formed in the proximity of the board attaching section 81 of the bottom section 73A. The sensor attaching section 77A and the parts attaching section 82A are formed on diagonal positions on the bottom section 42A.

The sensor attaching section 77A has a positioning section 84A which is surrounded by a wall section 83A, and is thus formed on the bottom section 73A, and an insertion passage hole (insertion hole) 85A bored into in this positioning section 84A. The insertion passage hole 85A communicates with the aperture section 46A, which opens to the intake manifold 33A side with respect to the throttle valve 24A, of the intake passage 16A.

As shown in FIG. 9, the intake air pressure sensor 43A has an insertion section 87A which is inserted into the insertion passage hole 85A, and whose tip end surface is a detection section 86A, and a sensor body section 88A which is positioned with respect to the housing 20A, by being mounted in the positioning section 84A so that the insertion section 87A is inserted into the insertion passage hole 85A. A plurality of connection pins 89A which extend in the direction opposite to that of the insertion section 87A, are provided (specifically at three places) on the sensor body section 88A. Moreover, a cylinder shaped sealing member 91A is installed in a gap between the outer surface of the insertion section 87A and the inner surface of the insertion passage hole 85A. This sealing member 91A is inserted into the insertion passage hole 85A together with the insertion section 87A, in a state of having been pre-engaged with the insertion section 87A.

The parts attaching section 82A has a positioning section 93A which is surrounded by a wall section 92A and is formed on the bottom section 73A, and a screw hole 94A formed in this positioning section 93A.

The power transistor 44A is positioned in the housing 20A by being mounted inside the positioning section 93A. In this positioned state, by screwing an attaching screw 95 into the screw hole 94A through the power transistor 44A, the power transistor 44A is attached so that it directly contacts with the bottom section 42A of the housing 20A (in other words, is directly attached). As shown in FIG. 8, a plurality of connection pins 97A which extend to the opening section 71A side in this attached state, are formed (specifically at three places) on the power transistor 44A.

Electric parts 102A, external connection wiring 103A, and so forth, are pre-mounted on the circuit board 45A. A guide hole 98A for insertion of the insertion pin 75A, and a guide hole 99A for insertion of the insertion pin 80A, are formed in diagonally opposite positions on the rectangular circuit board 45A. As shown in FIG. 9, on the circuit board 45A in the proximity of the one guide hole 98A, connection holes 100A for insertion of the connection pins 89A of the intake air pressure sensor 43A in a condition attached to the housing 20A are formed numbering as many as the number of the connection pins 89A. In the position in the proximity of the other guide hole 99A, connection holes 101A for insertion of the connection pins 97A of the power transistor 44A in a condition attached to the housing 20A are formed numbering as many as the number of the connection pins 97A.

When attaching these parts, the intake air pressure sensor 43A in a condition with the sealing member 91A fitted to the insertion section 87A, is attached to the sensor attaching section 77A of the bottom section 42A of the housing 20A, and after the power transistor 44A has been attached to the parts attaching section 82A, the circuit board 45A is attached to the housing 20A. In other words, the circuit board 45A is mounted on both the mounting stands 74A and 79A, inserting the connection pins 89A and 97A of the intake air pressure sensor 43A and the power transistor 44A into the connection holes 100A and 101A of the circuit board 45A, while inserting the insertion pins 75A and 80A of both board attaching sections 76A and 81A of the housing 20A, into both guide holes 98A and 99A which are diagonally positioned on the circuit board 45A.

Next, the connection pins 89A and 97A which project from the circuit board 45A to the opening section 71A side are connected to the circuit board 45A by means of soldering or the like.

Next, by carrying out resin potting into the housing 20A, which is in the state of accommodating the circuit board 45A, so as to fill up to the level of the opening section 71A, the circuit board 45A, the intake air pressure sensor 43A, and the power transistor 44A are embedded in the potting resin 47A. As a result, the circuit board 45A, in the state of being mounted on both the mounting stands 74A and 79A, is attached to both the board attaching sections 76A and 81A, and is thus attached to the housing 20A.

Figure 11:
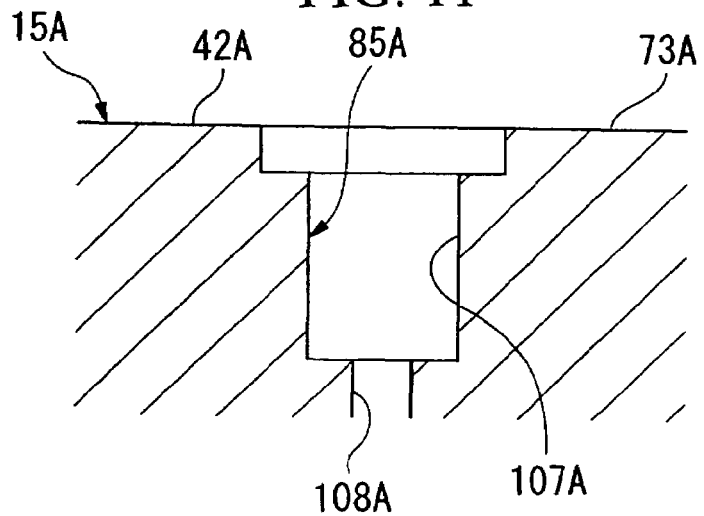
FIG. 11 is an enlarged sectional side view of a sensor attaching section in the throttle body of the throttle body assembly, showing a state where a sensor has not been attached.
Figure 12:
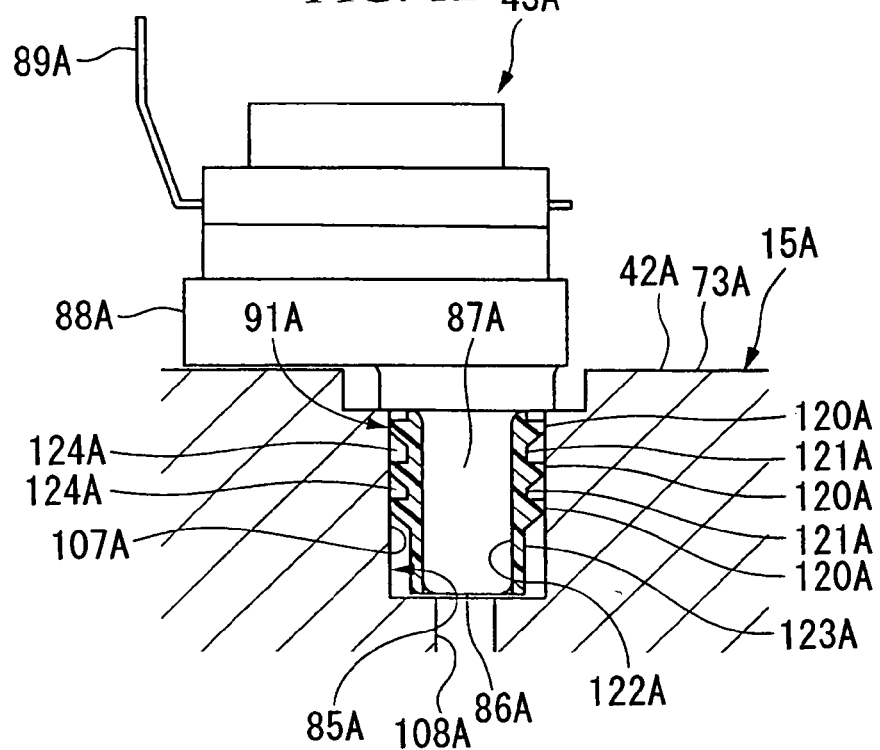
FIG. 12 is an enlarged sectional side view of the sensor attaching section of the throttle body, showing a state after the sensor has been attached.

According to the present embodiment described above, as shown in FIG. 9, a pressure detection passageway 105A, which includes the insertion passage hole 85A of the sensor attaching section 77A formed on the throttle body base 15A, is communicated with the intake passage 16A, and the intake air pressure sensor 43A detects the pressure in the intake passage 16A via this pressure detection passageway 105A. The insertion passage hole 85A is bored orthogonal to the bottom section 73A, on a corner on the outlet side duct section 19A side and the throttle opening sensor 28A side of the bottom section 73A of the housing 20A. Moreover, as shown in FIG. 10 to FIG. 12, this insertion passage hole 85A has a fitting hole section 107A which has a circular axi-orthogonal cross-section, and with which a sealing member 91A that covers the outer surface of the insertion section 87A of the intake air pressure sensor 43Aa engages, and a small hole section 108A which is further depressed from the bottom of the fitting hole section 107A, has a smaller diameter than that of the fitting hole section 107A, and is coaxial therewith, and has a circular axi-orthogonal cross-section. A communication passage 110A (refer to FIG. 9) is formed so as to be orthogonal to the small hole section 108A of the insertion passage hole 85A, and this communication passage 110A furthermore communicates with an aperture section 46A via another communication passage hole.

In the present embodiment, the cylinder shaped sealing member 91A installed in the gap between the inner surface of the fitting hole section 107A of the insertion passage hole 85A and the outer surface of the insertion section 87A of the intake air pressure sensor 43A, has a cylindrical shape on an inner surface 122A side. Furthermore, on an outer surface 123A side of this sealing member 91A, a plurality of annular large crest sections 120A and a plurality of annular small valley sections 121A are formed so as to alternate continuously and smoothly. Specifically, the sectional shape of the outer surface 123A on the side facing the insertion passage hole 85A has a corrugated shape along its axial direction.

The length of this sealing member 91A in the axial direction is equal to the length of the insertion section 87A in the axial direction, and the sealing member 91A is fitted onto the insertion section 87A up to where it contacts with the sensor body section 88A. As a result, in the insertion section 87A, the tip end position of the sealing member 91A in the state of being attached, coincides with the tip end position of the detection section 86A.

By fitting the cylindrical insertion section 87A into the cylindrical surfaced inner surface 122A of the sealing member 91A, the intake air pressure sensor 43A is mounted in the housing 20A by mounting the sensor body section 88A on the positioning section 84A, while fitting the insertion section 87A having its outer surface covered with the sealing member 91A, into the fitting hole section 107A of the insertion passage hole 85A together with the sealing member 91A. At this time, all the large crest sections 120A of the sealing member 91A are affixed around the entire periphery of the fitting hole section 107A, so that the gap between the sealing member 91A and the fitting hole section 107A is sealed. All the small valley sections 121A of the sealing member 91A are distanced from the fitting hole section 107A around the entire periphery. As a result, space sections 124A are formed between the small valley sections 121A and the large crest sections 120A on both sides thereof, and the fitting hole section 107A.

Subsequently, the potting resin 47A is filled inside the housing 20A in which the circuit board 45A is disposed as described above. Since due to the above, the gap between the fitting hole section 107A and the insertion section 87A of the intake air sensor 43A is sealed by the sealing member 91A, the potting resin 47A can be prevented from entering therein.

According to the present embodiment described above, the sealing member 91A is installed in the gap between the outer surface of the insertion section 87A and the inner surface of the fitting hole section 107A. As a result, by just pre-fitting the sealing member 91A to the outer surface of the insertion section 87A and inserting the insertion section 87A into the insertion passage hole 85A together with the sealing member 91A, the sealing member 91A and the intake air pressure sensor 43A can be attached. Therefore, the sealing member 91A and the intake air pressure sensor 43A can be easily attached. In addition, since dimensional errors of the insertion passage hole 85A can be absorbed due to deformation of the sealing member 91A, the tolerance range of the processing accuracy of the insertion passage hole 85A can be widened, and processing becomes easier. Furthermore, the sealing member 91A can prevent the resin potting from flowing around to the detection section 86A side of the tip end surface of the insertion section 87A.

Also, even with the sealing member 91A fitted to the outer surface of the insertion section 87A, and inserting the insertion section 87A as is together with the sealing member 91A into the insertion passage hole 85A, the insertion section 87A can be inserted easily into the insertion passage hole 85A due to the plurality of the large crest sections 120A and small valley sections 121A, which are alternately arranged to form a corrugated shape. Moreover, when embedding the intake air pressure sensor 43A in the resin potting, even if the potting resin 47A enters into the gap between the sealing member 91A and the insertion passage hole 85A, the potting resin 47A can be accommodated in the space sections 124A formed between the small valley sections 121A (that is, the valley part of the corrugation) and the large crest sections 120A on both sides thereof, and the fitting hole section 107A. Therefore, the potting resin 47A can be reliably prevented from flowing around to the detection section 86A on the tip end surface side of the insertion section 87A.

Figure 13:
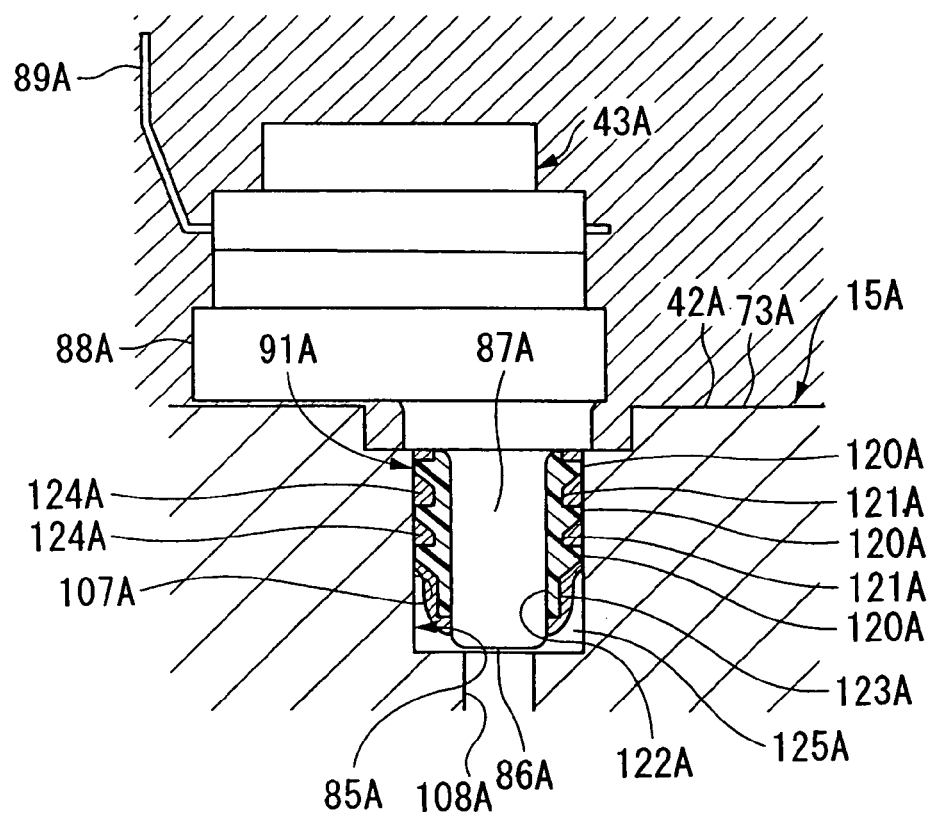
FIG. 13 is an enlarged sectional side view that shows another example of the sensor attaching section, showing a state after the sensor has been attached.

As shown in FIG. 13, in the case where the axial length of the sealing member 91A is made shorter than that of the insertion section 87A, if the sealing member 91A is fitted onto the insertion section 87A until it contacts with the sensor base section 88A, the tip end side of the insertion section 87A having the detection section 86A can be projected from the sealing member 91A.

By having the tip end side of the insertion section 87A projected from the sealing member 91A in this way, even if the potting resin 47A did enter over all the space sections 124A between the sealing member 91A and the insertion passage hole 85A, the potting resin 47A can be accommodated in a space section 125A between the tip end side of the insertion section 87A and the fitting hole section 107A. Therefore, the potting resin 47A can be still further reliably prevented from flowing around to the detection section 86A on the tip end surface of the insertion section 87A.

INDUSTRIAL APPLICABILITY

The present invention relates to an electric parts attaching structure and attaching method for a throttle body. Furthermore, the present invention relates to a throttle body having an intake passage in which a throttle valve is arranged.

According to an electric parts attaching structure and attaching method for a throttle body of the present invention, the intake passage information detection sensor is attached to the bottom section of the housing of the throttle body before attaching the circuit board, and subsequently the circuit board can be attached to the housing while inserting the connection pins extending from the intake passage information detection sensor, into the connection holes, so that the circuit board is disposed on the side opposite to the bottom section of the intake passage information detection sensor. Accordingly, since vision is not obstructed by the board when the intake passage information detection sensor is attached to the housing, the intake passage information detection sensor can be attached to the housing without imparting shocks to the intake passage information detection sensor. As a result, the intake passage information detection sensor can be easily attached to the housing without any loss of reliability.

Furthermore, according to the throttle body of the present invention, since the sealing member is installed in the gap between the outer surface of the insertion section of the intake passage information detection sensor and the inner surface of the insertion hole of the throttle body, the sealing member and the intake passage information detection sensor can be attached for example by just pre-fitting the sealing member to the outer surface of the insertion section, and inserting the insertion section in this state into the insertion hole together with the sealing member. Therefore, the sealing member and the intake passage information detection sensor can be easily attached. In addition, since dimensional errors of the insertion hole can be absorbed due to deformation of the sealing member, a tolerance range of the processing accuracy of the insertion hole can be widened, and processing becomes easier.

The invention claimed is:

1. An electric parts attaching structure for a throttle body comprising:
   a throttle body having an intake passage in which a throttle valve is arranged, and a housing formed on an outside thereof for accommodating electric parts;
   an intake passage information detection sensor which is attached to a bottom section of the housing for detecting information in the intake passage, and which has first connection pins extending therefrom; and
   a circuit board which has connection holes, arranged so as to sandwich the intake passage information detection sensor together with the bottom section of the housing, and is attached to the housing while inserting the first connection pins into the connection holes, wherein
   heat generating parts are attached to the bottom section of the housing,
   the circuit board is attached to the housing so as to sandwich the heat generating parts together with the bottom section of the housing, while inserting second connection pins extending from the heat generating parts into the connection holes,
   the intake passage information detection sensor and the heat generating parts are arranged in diagonally opposite positions on the bottom section of the housing, and
   attaching sections for the circuit board provided on the bottom section of the housing are arranged next to the intake passage information detection sensor and the heat generating parts.

2. An electric parts attaching method for a throttle body having an intake passage in which a throttle valve is arranged, and a housing formed on an outside thereof for accommodating electric parts, the method comprising:
   attaching an intake passage information detection sensor which detects information of an inside of the intake passage, to a bottom section of the housing;
   attaching a circuit board to the housing while inserting first connection pins extending from the intake passage information detection sensor into connection holes, so as to sandwich the intake passage information detection sensor together with the bottom section of the housing; and attaching a heat generating parts to the bottom section of the housing, wherein
while attaching the circuit board to the housing, the heat generating parts is arranged such that second connection pins extending therefrom are inserted into connection holes, asn such that the heat generating parts is sandwiched between the circuit board and the bottom section of the housing,
the intake passage information detection sensor and the heat generating parts are arranged in diagonally opposite positions on the bottom section of the housing, and
an attaching section for the circuit board provided on the bottom section of the housing is arranged so as to be next to the intake passage information detection sensor and the heat generating parts.

3. A throttle body comprising:
an intake passage in which a throttle valve is arranged;
an insertion hole which communicates with the intake passage;
an intake passage information detection sensor which has in insertion section inserted in the insertion hole, and which detects information of an inside of the intake passage; and
a sealing member installed in a gap between an outer surface of the insertion section and an inner surface of the insertion hole,
wherein the sealing member has a cylinder shape with a corrugated outer surface formed thereon.

4. The throttle body according to claim 3, wherein a tip end side of the insertion section projects from the sealing member.

5. The throttle body according to claim 3, wherein the intake passage information detection sensor is embedded in a resin potting.

* * * * *